(12) United States Patent
Ensslin et al.

(10) Patent No.: US 7,134,592 B2
(45) Date of Patent: Nov. 14, 2006

(54) METHOD AND PROTECTION APPARATUS FOR INSTALLATION OF A TEMPERATURE-SENSITIVE ELECTRONIC COMPONENT

(75) Inventors: Ulrich Ensslin, Stuttgart (DE); Norbert Niemczyk, Profzheim (DE)

(73) Assignee: DaimlerChrysler AG, Stuttgart (DE)

( * ) Notice: Subject to any disclaimer, the term of this patent is extended or adjusted under 35 U.S.C. 154(b) by 274 days.

(21) Appl. No.: 10/661,785

(22) Filed: Sep. 15, 2003

(65) Prior Publication Data

US 2004/0124233 A1 Jul. 1, 2004

Related U.S. Application Data

(63) Continuation of application No. PCT/EP02/01325, filed on Feb. 8, 2002.

(30) Foreign Application Priority Data

Mar. 13, 2001 (DE) ................. 101 12 355

(51) Int. Cl.
*B23K 31/02* (2006.01)
*B23K 35/12* (2006.01)

(52) U.S. Cl. ............... 228/260; 228/214; 228/37; 228/59

(58) Field of Classification Search ............. None
See application file for complete search history.

(56) References Cited

U.S. PATENT DOCUMENTS

| | | | |
|---|---|---|---|
| 3,031,738 A | | 5/1962 | Paulovitz |
| 3,723,943 A | * | 3/1973 | Hotze ........................... 439/72 |
| 4,216,051 A | * | 8/1980 | Brown et al. ................ 156/499 |
| 5,644,475 A | * | 7/1997 | Woychik et al. ............ 361/767 |
| 5,913,552 A | * | 6/1999 | McLellan et al. ............. 29/843 |
| 6,142,357 A | * | 11/2000 | Howell ......................... 228/39 |
| 6,145,729 A | * | 11/2000 | Thompson, Sr. ............. 228/39 |
| 6,145,733 A | * | 11/2000 | Streckfuss et al. ........ 228/180.1 |
| 6,267,288 B1 | * | 7/2001 | Chung ........................ 228/44.7 |
| 6,585,149 B1 | * | 7/2003 | Nakatsuka et al. ...... 228/180.1 |

FOREIGN PATENT DOCUMENTS

| | | | |
|---|---|---|---|
| DE | | 2129918 | 12/1972 |
| DE | | 2129918 B | * 1/1976 |
| DE | | 2949914 | 7/1980 |
| DE | | 19607726 | 9/1997 |
| EP | | 0480802 A2 | 12/1991 |

(Continued)

OTHER PUBLICATIONS

Notification of Reasons for Refusal (Japanese Office Action) dated May 19, 2006 with an English translation (Five (5) pages).

(Continued)

*Primary Examiner*—Lynne R. Edmondson
(74) *Attorney, Agent, or Firm*—Crowell & Moring LLP

(57) ABSTRACT

Temperature-sensitive electrical and electronic components which are connected to a board by soldering during the installation process are protected from the heat during the soldering process in order to prevent permanent damage to the components. The solder connections of the component are thermally coupled to a protection apparatus during the soldering process, so that some of the heat which is introduced into the solder connections during the soldering process is passed to the protection apparatus. The protection apparatus also has a protection sleeve, which surrounds the component in places. The protection sleeve is advantageously composed of a thermally insulated material, and is provided with a coating with a high thermal reflection capability in places on its outer wall which faces away from the component.

5 Claims, 2 Drawing Sheets

FOREIGN PATENT DOCUMENTS

| | | | |
|---|---|---|---|
| EP | 750325 A1 * | 12/1996 |
| EP | 0750325 A1 | 12/1996 |
| GB | 1330716 | 9/1973 |
| JP | 48-51254 A | 7/1973 |
| JP | 63-55577 U | 4/1988 |
| JP | 02155109 | 6/1990 |
| JP | 03036796 | 2/1991 |
| JP | 10135589 | 5/1998 |

OTHER PUBLICATIONS

Correspondence dated Jul. 27, 2006 (Three (3) pages).

* cited by examiner

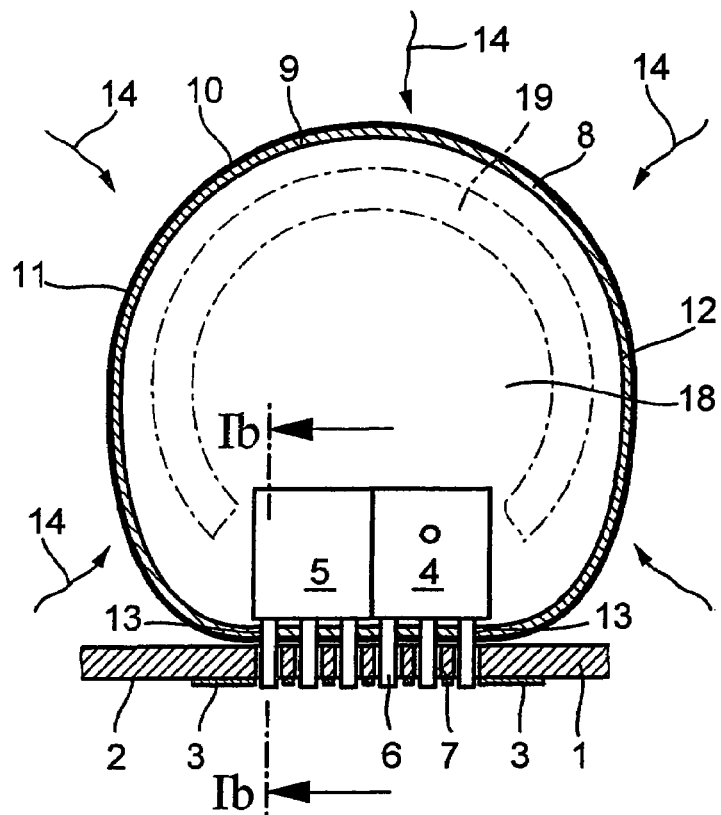
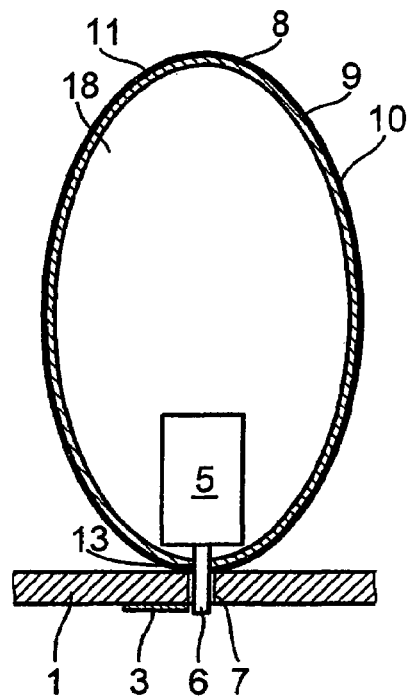
Fig. 1a      Fig. 1b
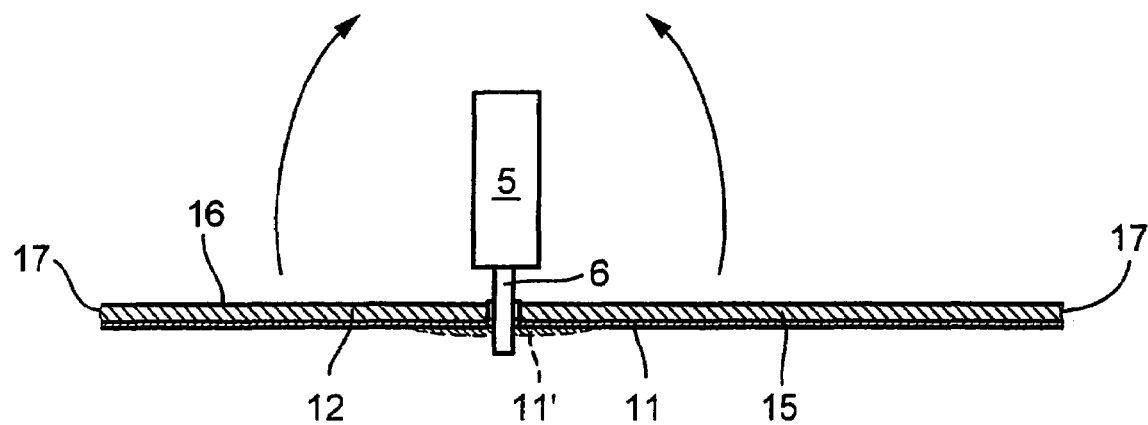
Fig. 1c

METHOD AND PROTECTION APPARATUS FOR INSTALLATION OF A TEMPERATURE-SENSITIVE ELECTRONIC COMPONENT

BACKGROUND AND SUMMARY OF THE INVENTION

This application is a continuation of PCT Application No. PCT/EP02/01325, filed on Feb. 8, 2002, which claims the benefit of priority to German Application No. 101 12 355.8 filed Mar. 13, 2001.

The invention relates to a method for installation of a temperature-sensitive electronic component on a board comprising providing a board which has openings for solder connections on an electronic component to pass through, providing a removable protection apparatus to protect the component during the installation process, moving the component first so close to the board that the solder connections project through the openings in the board, connecting the solder connections using a soldering method to a conductor track which is provided on a side of the board which faces away from the component, and subsequently removing the protection apparatus once the soldering process has been completed. The invention also relates to protection apparatus for a temperature-sensitive electronic optoelectronic component, for use during an installation process during which solder connections which are provided on the component are connected to a conductor track which is provided on a side of a board which faces away from the component.

Many electronic and electrical assemblies and components have temperature-sensitive electrical and/or electronic components such as heat-sensitive integrated circuits, lithium batteries, oscillator crystals and optoelectronic components. In the course of the installation of an assembly such as this, the electrical contacts that are provided on the components must be reliably connected to conductor tracks on a board and/or to electrical contacts on other components. This installation process is preferably carried out using a soldering method, in which solder connections which are provided on the component are soldered to the board. Each component in this case has a safe range for the soldering time and temperature, in which good soldered joints can be produced. At the same time, the temperature-sensitive electrical and electronic components must not be excessively heated, in order to prevent permanent damage. Heat-sensitive components are thus subject to contradictory requirements during soldering, on the one hand with the need to ensure sufficiently high soldering temperatures for soldering in the area of the solder connections while, on the other hand, keeping the temperature sufficiently low in the temperature-sensitive areas of the components that no damage occurs to the components.

In order to avoid excessive heating of temperature-sensitive components during soldering of SMD applications, U.S. Pat. No. 5,913,552 proposes that the relevant components be provided with a cover, which is placed from above over the components to be soldered. This cover forms a heat shield for the thermal radiation which acts on that side of the components which faces away from the board during infrared soldering or vapor phase soldering. However, a cover such as this is suitable only for the use of SMD applications in which the solder connections for the components are connected to the side of the board which faces the components using a reflow soldering method. If, on the other hand, the solder connections of the components are passed through openings in the board and are soldered to conductor tracks on the side which faces away from the component (for example by dip soldering or wave soldering), then a cover as known from this U.S. Pat. No. 5,913,552 and which is placed onto the upper face of the component which faces away from the board offers no protection whatsoever, since in this case the heat primarily acts on the component from the board side.

German Patent Document No. DE 196 07 726 A1 discloses a component for surface mounting on a printed circuit board, which is intended to be protected by a reflective metal foil, which is fitted on the component, against excessive heating, by the thermal radiation acting on it during the soldering process. Although this metal foil also protects the component against thermal radiation which acts on the component from the side which faces away from the board, it does not, however, offer any protection against thermal radiation which acts on the component from the board side.

Furthermore, a printed circuit board whose upper and lower layer are metallized is known from Japanese Patent Document No. JP 030 36796 A; the aim in this case is to improve the heat dissipation to the printed circuit board from the components which are inserted into the printed circuit board via connecting pins. However, this metallization does not provide any thermal protection for the components during high-temperature dip soldering.

In order to provide protection during soldering for a component which projects through the board, in particular a variable capacitor, it is known from German Patent Document No. DE-A 29 49 914, which forms the generic profile art in this case, for that area of the component which projects through the board to be covered by a cap; in order to protect capacitors which are intended to be accessible through an opening in the board after the soldering process, the invention also proposes that this opening be protected during the soldering process by a protection platelet, which is removed after the soldering process. Although a protection platelet such as this can protect the capacitor against heat and solder vapor acting on the lower face of the component, on the board side, and which could damage the capacitor if the opening were not covered; the platelet does not, however, offer any protection against the influence of heat which acts on all sides of the component as a result of the heat in the soldering oven or the solder bath. A protection platelet such as this can thus offer only inadequate protection for particularly temperature-sensitive components.

An object of the invention is to provide a method and a protection apparatus, by means of which a temperature-sensitive component can be protected particularly effectively against heat during the soldering process.

According to one aspect of the invention, this object is achieved by providing a method for installation of a temperature-sensitive electronic component on a board, comprising providing a board which has openings for solder connections on an electronic component to pass through, providing a removable protection apparatus to protect the component during the installation process, the component is first moved so close to the board that the solder connections project through the openings in the board, connecting the solder connections using a soldering method to a conductor track which is provided on a side of the board which faces away from the component, and subsequently removing the protection apparatus once the soldering process has been completed, wherein the component is thermally coupled to the protection apparatus during the soldering process so that some of the heat which is introduced into the solder connections during the soldering process is passed to the protection apparatus. According to another aspect of the invention this object is achieved by providing a protection apparatus for a temperature-sensitive electronic optoelectronic component, for use during an installation process during which solder connections which are provided on the component are connected to a conductor track which is provided on a side of a board which faces away from the component, wherein the protection apparatus is configured to be selectively removed from the component, wherein the protection apparatus comprises a protection sleeve which surrounds at least portions of the component, and wherein the protection apparatus can be thermally coupled to the component.

According to preferred embodiments, the component is provided during the soldering process with a removable protection apparatus having a protection sleeve which surrounds the component in places and protects it from the environmental influences during the soldering process. The protection apparatus is thermally coupled to the component, and thus results in the heat which is introduced into the component from the solder bath during the soldering process being (at least partially) dissipated to the protection apparatus. This makes it possible to considerably reduce the heating of the component interior during the soldering process, and the risk of damage to the operation of the component.

According to certain preferred embodiments of the invention, the protection apparatus is advantageously coupled to the solder connections of the component, in order that the heat which is introduced into the solder connections from the solder bath is not passed completely to the component but, instead of this, is partially dissipated via the protection apparatus.

According to certain preferred embodiments of the invention, on its inner wall which faces the component, the protection sleeve expediently has a thermally insulating material, and is provided at least in places with a coating having high thermal conductivity on its outer wall which faces away from the component. The coating on the outer wall, which has high thermal conductivity, ensures that thermal radiation which acts on the component from the outside is distributed along the outer wall of the protection sleeve, is reflected, and is thus kept away from the component. The thermally insulating material which is used for the inner wall of the protection sleeve which faces the component in this case means that any heat which is introduced into the reflective outer wall is preferably radiated outwards, and only a small proportion of it is radiated in the direction of the component. In this case, the expression "thermally insulating" means a material with low thermal conductivity, such as polyester, polyethylene, polyamide, etc.

In order to achieve a particularly good protection effect for the component against the heat which is introduced during the soldering process, the thermally conductive outer wall of the protection sleeve is thermally coupled to the component, preferably to the solder connections of the component. In consequence, some of the heat which is introduced into the solder connections from the hot solder bath during the soldering process is passed to the outer wall of the protection sleeve, and is radiated from there into the environment. This results in the soldering heat being dissipated particularly quickly, thus providing particularly effective protection for the temperature-sensitive component.

According to certain preferred embodiments of the invention, in one particularly simple refinement, the protection apparatus is formed by a closed bubble composed of a thermally insulating film, in particular a polyester film, whose wall which faces away from the component is coated with a thermally highly conductive metal (for example copper or aluminum). The bubble surrounds the component in such a way that the solder connections pass through the wall, thus ensuring that the solder connections are thermally coupled to the wall of the bubble. After the soldering process, the bubble is removed by tearing it open in the area of the solder connections; in this case, the holes which are produced by the solder connections in the bubble act as perforations to assist the tearing process.

According to certain preferred embodiments of the invention, in a further refinement, the protection apparatus is formed by an elastic clip with thermally conductive clamping edges, between whose clamping edges the protection sleeve is arranged. Before the soldering of the component, the clip is preferably attached to the component such that the solder connections of the component are clamped in between the clamping edges of the clip, and the protection sleeve surrounds the component. After completion of the soldering process, the protection apparatus is removed by releasing the clip.

According to certain preferred embodiments of the invention, wave soldering is expediently used for connecting the solder connections of the component to the board. In this method, the populated board is passed through a standing soldering wave; the speed at which it passes through the solder wave must in this case be chosen such that, on the one hand, the board and the solder connections are wetted well while, on the other hand, the thermal load on them is not excessive. The method allows heat to be supplied quickly and is thus particularly suitable for boards with plated-through holes.

Alternatively, according to certain preferred embodiments of the invention, dip soldering can also be used, in which the rear face of the board, which faces away from the component, is immersed in a bath of melted solder, and is thus wetted with solder.

Other objects, advantages and novel features of the present invention will become apparent from the following detailed description of the invention when considered in conjunction with the accompanying drawings.

BRIEF DESCRIPTION OF THE DRAWINGS

FIGS. 1a and 1b are sectional schematic views through an electrical component with a protection apparatus in the form of a bubble, constructed according to certain preferred embodiments of the invention;

FIG. 1c schematically shows the production of the bubble from a piece of film.

DETAILED DESCRIPTION OF THE DRAWINGS

Figure 2:
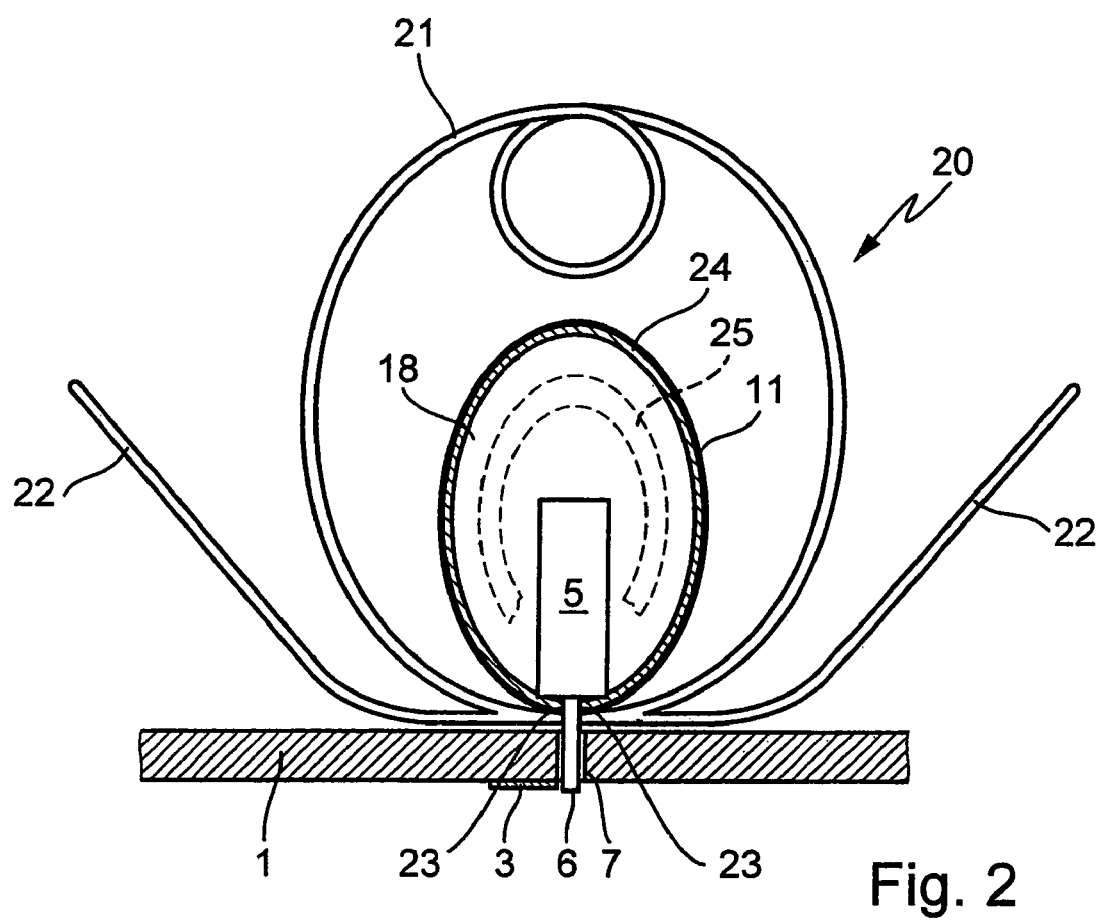
FIG. 2 is a sectional schematic view through an electrical component with a protection apparatus in the form of an elastic clip, according to certain preferred embodiments of the invention.

FIGS. 1a and 1b show schematic section views of a board 1, on whose rear face 2 a printed circuit 3 is provided. This board 1 is intended to be fitted with an optoelectronic emitter 4 and an optoelectronic receiver 5. For this purpose, the components 4, 5 have solder connections 6, which are passed through openings 7 in the board 1, and are soldered to the printed circuit 3 on the side 2 of the board 1 which faces away from the components 4, 5.

Many optoelectronic components 4, 5 are temperature-sensitive and are damaged if they are excessively overheated. The emitter 4 in particular must not be subjected to excessively high temperatures, which would otherwise change its emission characteristic. Under the influence of temperatures of more than 100°, the optical power on the emitter 4 decreases noticeably and it suffers permanent damage, since the transmission characteristics of the synthetic resin contained in the emitter become considerably poorer at these increased temperatures.

On the other hand, in order to achieve a good solder result, the components 4, 5 must be subjected to increased temperatures for lengthy times during the soldering process: for example, during wave soldering, the component 4, 5 which is plugged onto the board 1 is first of all heated up slowly to about 100°. The actual soldering process takes place after this, is typically carried out at about 260° and lasts for at least 5 seconds, followed by the solidification phase, during which the component is cooled down slowly. When using environmentally friendly lead-free solders, temperatures of even about 300° are required for more than 5 seconds in order to reliably produce a good soldered joint.

In order to efficiently protect components 4, 5 from the increased temperatures which occur during this soldering process (which last for a total of several minutes), the components 4, 5 are provided during the soldering process with a protection apparatus 8, which is removed after completion of the soldering process. In the exemplary embodiment shown in FIGS. 1a and 1b, this protection apparatus 8 is formed by a bubble 9 composed of a polyester film, whose outer wall 10 is provided with a metallic coating 11. The solder connections 6 of the components 4, 5 project outwards through the bubble wall 12, and rest firmly on the bubble 9 in the area of the points 13 at which they pass through. The solder connections 6 are thus mechanically and thermally coupled to the bubble wall 12, thus ensuring that the solder connections 6 are thermally coupled to the metallic coating 11 on the outer wall 10 of the bubble 9.

The material of the bubble 9 forms a thermal insulation layer, which protects the components 4, 5 against the influence of heat from the outside during the soldering process; films composed of polyethylene, polypropylene and polyamide have been found to be particularly suitable for this purpose. The metallic coating 11 on the outer wall 10 of the bubble 9 (for example based on copper or aluminum) reflects the thermal radiation 14 which acts on the components 4, 5 from the outside and—owing to its high thermal conductivity—provides additional protection for the components 4, 5 against any locally concentrated influence of heat. The mechanical and thermal contact between the solder connections 6 and the metallic outer coating 11 on the bubble 9 also results in the thermal energy which is introduced into the solder connections 6 during the soldering process being at least partially passed to the outer wall 10 of the bubble 9, and being radiated from there, so that the interior of the component 4, 5 is heated to a much lesser extent, and is not damaged.

One particularly simple refinement of the bubble 9 is formed on the basis of a section of coated film 15—by the components 4, 5 being printed onto the heat-insulating side 16 of the film section 15 such that the solder connections 6 of the components 4, 5 pass through the film 15 (see FIG. 1c); the edges 17 of the film 15 are then folded around the components 4, 5 and are connected so as to form a closed bubble 9. In order to remove the bubble 9 after completion of the soldering process, the bubble 9 is torn apart along the solder connections 6, with the perforations that are caused by the solder connections making it easier to tear the bubble apart.

In order to ensure good thermal coupling of the metallic outer coating 11 on the bubble wall 12 to the solder connections 6, it may be advantageous to provide a thicker coating 11' in the area in which the solder connections 6 pass through the film 15 than in the areas of the film 15 which are closer to the edge; this is illustrated schematically in FIG. 1c, and is emphasized as a shaded area 11'. The material and layer thickness of the coating 11' and of the heat-insulating wall 16 in the area in which the solder connections 6 pass through it must be chosen such that, on the one hand, a good thermal contact is reliably ensured between the solder connections 6 and the coating 11' where the solder connections 6 pass through the film 15 and such that, on the other hand, the coating 11, 11' extracts only a comparatively small amount of heat during the soldering process from those areas of the solder connections 6 which have to be connected to the printed circuit 3, thus resulting in a good soldered joint between the solder connections 6 and the board 1.

As is shown by the dashed line area in FIG. 1a, a thermally insulating material 19 can also be arranged in the cavity 18 which is provided between the inner wall 16 of the bubble 9 and the components 4, 5, and this further prevents heat being transferred to the components 4, 5 during the soldering process.

An alternative refinement of the protection apparatus 8' according to the invention is illustrated in FIG. 2, the protection apparatus 8' is in this case formed by an elastic clip 20, which has an elastic clamping clip 21 and two grips 22. The metallic clamping edges 23 which are provided at the ends of the clamping clip 21 are pressed together by the clamping clip 21 and act on both sides on the solder connections 6 of the components 4, 5 so that they make mechanical and thermal contact with the solder connections. A protection sleeve 24 is arranged between the clamping edges 23 and surrounds the components when the clip 20 is fitted to the components 4, 5. The protection sleeve 24 is composed of the thermally insulating film 15 described above, whose outer wall 10 is provided with a metallic coating 11; the metallic outer wall 11 is thermally coupled to the clamping edges 23 so that heat which is introduced in the area of the solder connections 6 can be dissipated via the clamping edges 23 to the outer wall 11 of the protection sleeve 24. If the bracket 20 is fitted to the components 4, 5 before the start of the soldering process, then on the one hand the protection sleeve 24 protects the components 4, 5 against being influenced by thermal radiation during the soldering process while, on the other hand, the clamping edges 23 pass on the solder heat, which is introduced to the solder connections 6, to the protection sleeve 24 and to the grip 22, and thus prevent the interiors of the components 4, 5 from being damaged by the influence of this large amount of heat.

In order to ensure good heat dissipation, the clip 20 is preferably solid and is made of a metallic material. Alternatively or additionally, the metallic outer wall 11 may be composed of a thick metal foil, so that the protection sleeve 24 also has a high thermal mass.

The components 4, 5 can be cooled particularly effectively if the cavity 18 in the interior of the protection sleeve 24 is arranged to have a cooled additional material 25 (indicated by a dashed line area in FIG. 2) before the clip is fitted.

In addition to the coupling of the protection apparatus 8, 8' to the solder connections 6 of the component 4, 5 as shown in the figures, the protection apparatus 8, 8' may also be coupled to the housing of the component 4, 5.

The exemplary embodiments described so far have described the effect of the protection sleeve for optoelectronic components; however, the protection sleeve can also be used in general for any desired temperature-sensitive electrical and electronic components.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for installation of a temperature-sensitive electronic component on a board comprising:
   providing a board which has openings for solder connections on an electronic component to pass through,
   providing a removable protection apparatus including a thermal insulation layer and a metallic outer coating on an outer wall of the protection apparatus to protect the component during the installation process,
   moving the component first so close to the board that the solder connections project through the openings in the board,
   connecting the solder connections using a soldering process to a conductor track which is provided on a side of the board which faces away from the component while thermally coupling the solder connections to the metallic outer coating on the outer wall of the protection apparatus, and
   subsequently removing the protection apparatus once the soldering process has been completed,
   wherein some of the heat which is introduced into the solder connections during the soldering process is passed to the protection apparatus.

2. The method as claimed in claim 1, wherein the solder connections of the component are connected to the board by means of wave soldering.

3. A method according to claim 1, wherein said protection apparatus is a bubble, wherein said thermal insulation layer is a plastic layer facing the component with the metallic coating on the plastic layer facing away from the component, and wherein said solder connections in use penetrate the plastic layer with the metallic coating to thereby assure thermal and mechanical coupling of the solder connections with the metallic coating.

4. A method according to claim 3, wherein said removing includes tearing the bubble layer with the metallic coating along the solder connections with perforations formed by the solder connections facilitating said removing.

5. A method according to claim 4, wherein said component is bonded to a plastic layer side of the protection apparatus such that the solder connections pass through the plastic layer and the metallic outer coating and edges of said plastic layer and said metallic outer coating are folded around the components to form a closed bubble.

* * * * *